(12) United States Patent
Yang et al.

(10) Patent No.: US 7,286,396 B2
(45) Date of Patent: Oct. 23, 2007

(54) BIT LINE SELECTION TRANSISTOR LAYOUT STRUCTURE

(75) Inventors: Ling Kuey Yang, Changhua (TW); Chen Chin Liu, Hsinchu (TW); Lan Ting Huang, Kaohsiung (TW); Po Hsuan Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 7 days.

(21) Appl. No.: 11/248,506

(22) Filed: Oct. 12, 2005

(65) Prior Publication Data

US 2007/0081383 A1    Apr. 12, 2007

(51) Int. Cl.
    *G11C 11/40* (2006.01)
(52) U.S. Cl. ............... 365/177; 365/52; 365/72
(58) Field of Classification Search ............ 365/72
    See application file for complete search history.

(56) References Cited

U.S. PATENT DOCUMENTS

| | | | | |
|---|---|---|---|---|
| 4,959,812 A | * | 9/1990 | Momodomi et al. | 365/185.17 |
| 5,182,725 A | * | 1/1993 | Andoh et al. | 365/185.12 |
| 5,321,660 A | * | 6/1994 | Sani et al. | 365/210 |
| 5,528,547 A | * | 6/1996 | Aritome et al. | 365/218 |
| 5,554,867 A | * | 9/1996 | Ajika et al. | 257/314 |
| 5,559,737 A | * | 9/1996 | Tanaka et al. | 365/185.25 |
| 6,067,249 A | * | 5/2000 | Lee et al. | 365/185.05 |
| 6,879,529 B2 | | 4/2005 | Yamada | |

* cited by examiner

*Primary Examiner*—Tan T. Nguyen
(74) *Attorney, Agent, or Firm*—Baker & McKenzie LLP

(57) ABSTRACT

A BLT can include a different channel length, channel width, or both to compensate for bit line loading effects. The channel length and/or channel width of the transistor structure can be configured so as to achieve a desired loading. Thus, the bit line transistor structure can improve global metal bit line loading uniformity and provide greater uniformity in bit line bias. Additionally, the greater uniformity in bit line bias can improve reliability.

24 Claims, 3 Drawing Sheets

BIT LINE SELECTION TRANSISTOR LAYOUT STRUCTURE

BACKGROUND

1. Field of the Invention

The present invention relates generally to memory devices and more particularly to a transistor structure within a memory device and methods of designing and manufacturing transistor structures within memory devices.

2. Background of the Invention

Memory devices comprise a plurality of cells that can be programmed and erased. Each cell typically represents a bit of information and cells are typically arranged into words, where each word comprises a certain number of bits. The cells of conventional memory devices are also often arranged in sectors or blocks. Such devices can then be erased or written to on a sector or block basis.

In a conventional memory device, cells are often arranged into an array, where each cell in the array can be accessed via the appropriate combination of word and bit lines. Decoders are often coupled with the array and configured to drive the associated word and bit lines. These decoders can be referred to as word line and bit line decoders, or as X and Y decoders. The decoders can drive the associated word or bit lines and access the data bits stored in a given cell via transistors interfaced with the word and bit lines. For example, a bit line, or Y decoders can access a given cell via a selected bit line coupled with a Bit Line Transistor (BLT).

A conventional BLT layout structure uses the same size transistors throughout the memory device. But a conventional BLT layout can have problems with loading, especially during programming of the device since many of the cells are written to during programming. The problems can worsen as the size of the memory device is scaled down. BLT loading can become more of an issue as the device is scaled down because a higher number of structures in a given area on the silicon die lead to higher capacitance and/or greater current draw FIG. 2 is a diagram illustrating a portion of an exemplary memory array 200 that includes two BLTs 202 and 204. It will be understood that, generally, a memory array 200 can contain a plurality of BLTs, but that two BLTs 202 and 204 are shown for convenience. BLTs 202 and 204 can be associated with different sectors within array 200, e.g., sector 0 and sector 128, as shown. Each sector, 0 through 128 can, for example, include one or more BLTs.

In this example, Y-decoder 216 can be connected with BLTs 202 and 204 by a metal bit line 214. The loading of metal bit line 214 can be effected by each of the transistors 202 and 204 that are connected to it. For example, each transistor can add some capacitance to the metal bit line 214. As capacitance increases it can take additional current to drive bit line 214. Further, voltage drops can occur due to this capacitance along metal bit line 214, because of the increased current required to drive the capacitance associate with BLTs 202 and 204. This can, for example, affect the ability of a Y-decoder 216 to drive metal bit line 214. Depending on the design of traditional memory array 200 capacitance of transistor 204 can, for example, slow signals from propagating down metal bit line 214 to subsequent transistors that are further from Y-decoder 216.

SUMMARY

A BLT can include a different channel length, channel width, or both, relative to other BLTs connected to the same bit line in order to produce a desired bit line loading. Thus, the BLT structure can improve global metal bit line loading uniformity and provide greater uniformity in bit line bias. Additionally, the greater uniformity in bit line bias can improve reliability.

In one aspect, loading can be calculated for a bit line and then the design of a BLT can be modified to achieve the calculated bit line loading. Different structure dimensions can be used for different parts of a BLT depending on where it resides in the cell. For example, the channel length can be longer and the channel width can be narrower in a BLT nearest the Y-decoder.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
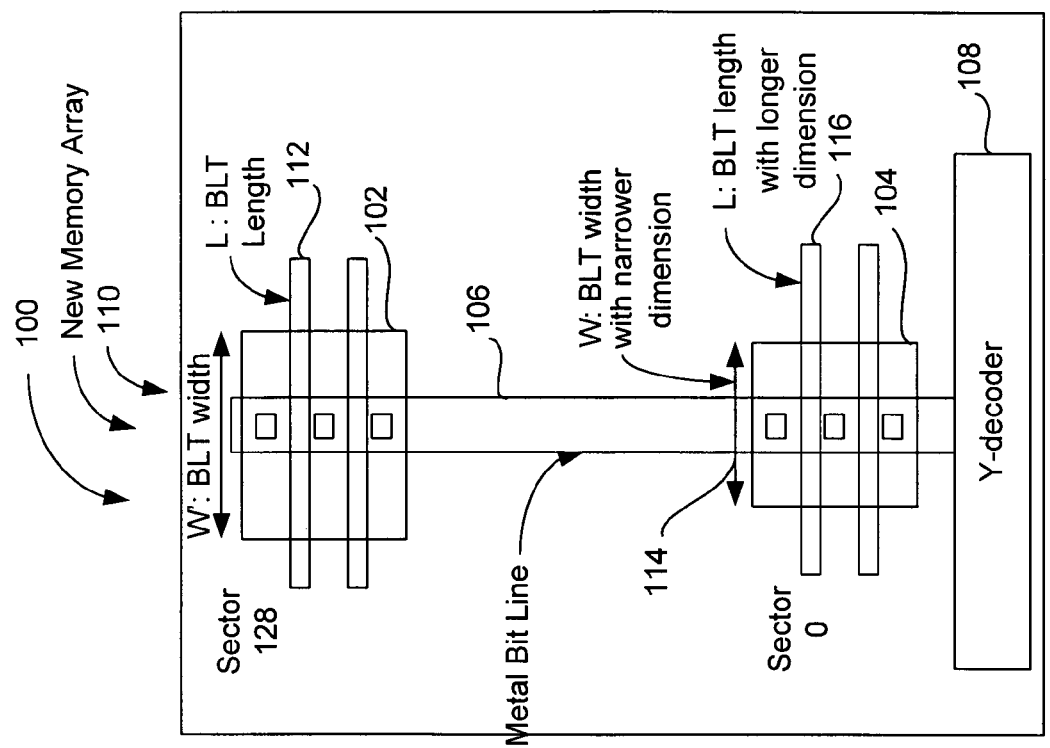
FIG. 1 is a diagram illustrating an example bit line transistor layout for a memory array in accordance with one embodiment.
Figure 2:
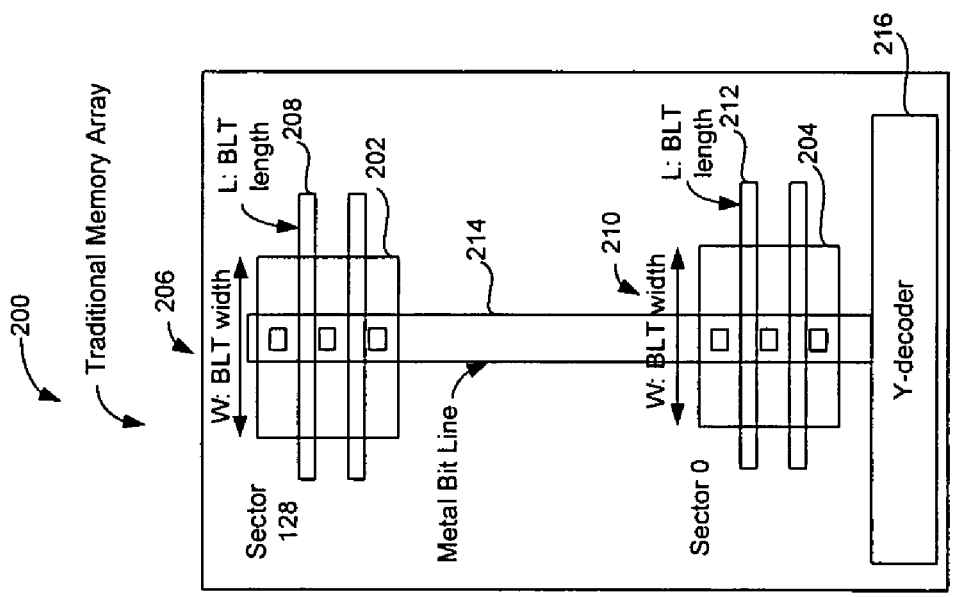
FIG. 2 is a diagram illustrating a bit lien transistor layout for an exemplary memory array.

FIG. 1 is a diagram illustrating a layout for a portion of an example memory array 100 configured in accordance with one embodiment of the systems and methods described herein. In FIG. 1, memory array 100 is shown as comprising two BLTs 102 and 104. It will be understood that only two transistors are shown for convenience and that array 100 can comprise any number of cells, or BLTs. Further, BLTs 102 and 104 can be part of the same sector or block, or different sectors or blocks. These BLTs 102 and 104 can be connected to a metal bit line 106 driven by Y-decoder 108. As explained, the capacitance of BLTs 102 and 104 can increase the loading on metal bit line 106. This capacitance can, however, be changed by changing channel length 112 and 116 and/or channel width 110 and 114 associated with each of transistors 102 and 104, respectively.

Further, it will be understood that other aspects of memory array 100 can also affect bit line loading, for example, the resistance of metal bit line 106. But the resistance of metal bit line 106 can also be changed based, e.g., on the physical dimensions of metal bit line 106 and/or the material used to construct metal bit line 106.

By determining a desired loading, a BLT dimension, such as length and/or width that will produce the desired loading, can be calculated for each transistor, e.g., BLTs 102 and 104. This approach improves global metal bit line loading uniformity and can provide greater uniformity in bit line bias. Greater uniformity in bit line bias can also improve reliability. Thus, transistors 102 and 104 can include different channel lengths 112 and 116, channel widths 110 and 114, or both, to compensate for the bit line loading effects described above. In other words, the channel length 112 and 116, and/or channel width 110 and 114 of transistors 102 and 104 can change the capacitance associated with each transistor. Therefore, changes to channel length 112 and 116 and/or width 110 and 114 can be used to change the loading on bit line 106. For example, in one embodiment, it can be preferable to have lower transistor capacitance near Y-decoder 108, because this can ultimately make it easier for Y-decoder 108 to drive transistor 102, which is further away from Y-decoder 108.

Thus, the channel length 116 and/or channel width 114 of transistor 104 can be configured so as to achieve a desired lower capacitance and desired loading of metal bit line 106. Further, as described above, different structures can be used for different parts of the device, for example, channel length 116 can be longer and channel width 114 can be narrower in transistor 104 nearest Y-decoder 108, whereas wider, shorter channels can be used for transistor 102, which is farther away from Y-decoder 108. It will be understood, however, that this is only one example. Bit line loading can vary from implementation to implementation, depending on the specific requirements and designed loading.

Alternatively, or in addition, the dimensions and material used for bit line 106 can be selected in order to help achieve the desired bit line loading. In other words, the desired bit line loading can, depending on the embodiment, be achieved through a combination of configuring the dimensions of BLTs 102 and 104 as well as configuring the dimensions and material used for bit line 106.

Figure 3:
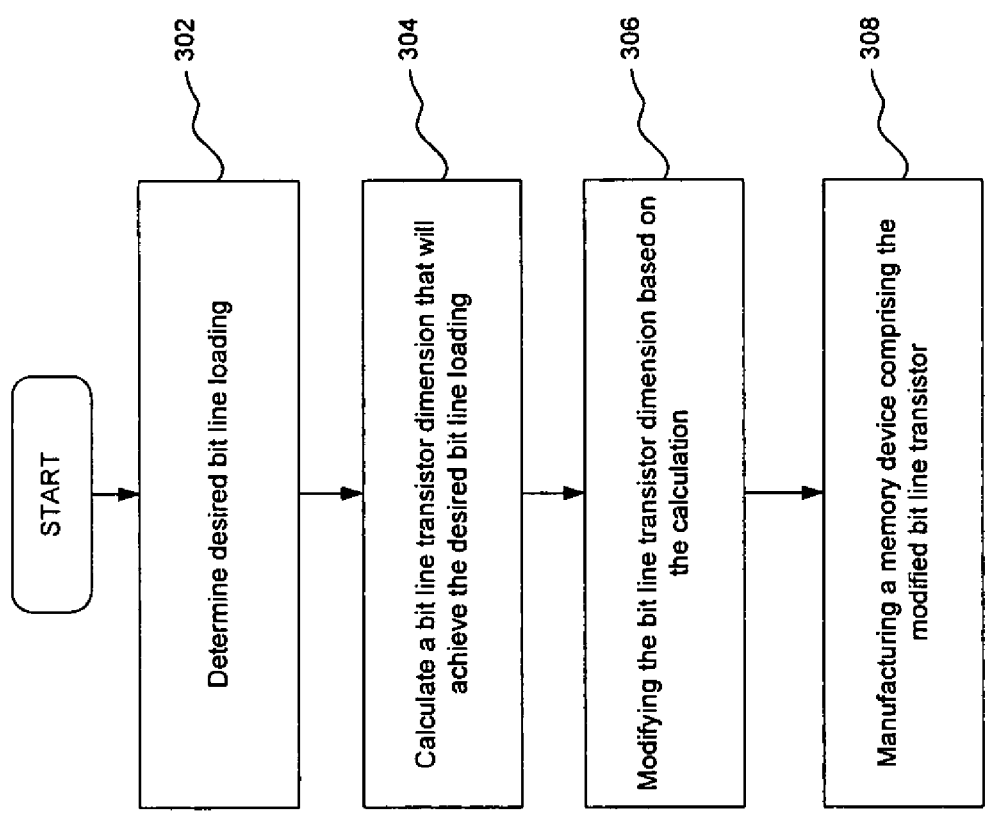
FIG. 3 is a flowchart illustrating an example method of designing and manufacturing the memory array of FIG. 4 in accordance with one embodiment.

FIG. 3 is a flowchart illustrating an example method of designing and manufacturing a memory array, such as memory array 100, in order to achieve a desired bit line loading in accordance with one embodiment of the systems and methods described herein. In step 302, a desired bit line loading is determined. This step can, for example, occur during design of a memory device and can, for example, include mathematical calculations. Further, predetermining bit line loading can include computer simulation, which can include a large number of mathematical calculations. These calculations and simulations can, for example, include calculations of capacitance for, e.g., transistors 102 and 104. Further, these calculations can include calculations of resistance, e.g., for metal bit line 106. It will be understood that, for large devices, the number of calculations can be extremely large, and therefore, it can be useful to use a computer to perform such calculations. Predetermining bit line loading can, however, also include fabricating a memory device and measuring bit line loading, either in addition to, or in place of calculations and/or simulations In step 304, a BLT dimension can be calculated to compensate for bit line loading. The transistor dimension can be, e.g., a BLT width 110 or 114, or a BLT length 112 or 116, as described above.

In step 306, the BLT dimension can be modified based on the calculation of step 306. It will be understood that the calculation of step 306 can include many calculations and/or computer simulation. Further, it will be understood that, in one embodiment, the steps 302, 304, and 306 can be repeated in an iterative process, e.g., to improve bit line loading. For example, bit line loading can be determined, a BLT dimension can then be determined to compensate for bit line loading, and one or more transistor dimensions can be modified to compensate for bit line loading. Bit line loading can then be determined again based on the new transistor dimension.

The modifications of step 306 can include, e.g., modifying one or more BLT widths 110 and 112, one or more BLT lengths 112 and 116, or some combination of length, width, or other modifications to, e.g., the physical layout of the transistors, or other parts of the device. Generally, the modification can include modifications to both BLT width 110 and 112 and BLT length 112 and 116.

Steps 302, 304, and 306 are one example of a method of designing a memory device. This method of designing a memory device can be combined with step 308, in which the memory device can be manufactured comprising the modified BLT. The modified transistor can have better bit line loading characteristics than a device with uniformly sized BLTs.

The examples discussed above include two transistors 102 and 104 with two different transistor sizes. It will be understood, however, that many different transistor dimensions can be used for the different BLTs throughout a device. For example, different transistor dimensions can be used in each transistor from the closest to Y-decoder 108 to the farthest away. Further, the transistor dimensions can be viewed by sector or bank, with transistors in a given sector or bank sharing transistor dimensions, relative to each other, but having different dimensions relative to transistors in other sectors or banks. Alternatively, transistor dimensions can be viewed within each sector or bank, e.g., with variations in transistor dimensions within each sector or bank determined for each given sector or bank.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A memory device comprising:
   a bit line;
   a first Bit Line Transistor (BLT) coupled to the bit line, the first BLT comprising a channel; and
   a second BLT coupled to the bit line, the second BLT comprising a channel, the dimensions of which are different from the dimensions of the first BLT channel, wherein the channel dimensions for the first and second BLTs comprise a channel width, and wherein the channel width for the first BLT is wider than the channel width for the second BLT.

2. The memory device of claim 1, wherein the channel dimensions for the first and second BLTs comprise a channel length, and wherein the channel length for the first BLT is shorter than the channel length for the second BLT.

3. The memory device of claim 1, further comprising a Y-decoder, coupled to the first and second BLTs through a bit line and proximate to the second BLT.

4. The memory device of claim 1, wherein the first and second BLTs are in different sectors.

5. The memory device of claim 1, wherein the first and second BLTs are in the same sector.

6. A method of designing a memory device comprising:
   determining desired bit line loading;
   calculating a bit line transistor dimension that will achieve the desired bit line loading; and
   modifying the bit line transistor dimension based on the calculation.

7. The method of claim 6, wherein the transistor dimension comprises a channel length.

8. The method of claim 7, wherein the channel length is longer for a transistor near a Y-decoder.

9. The method of claim 6, wherein the transistor dimension comprises a channel width.

10. The method of claim 9, wherein the channel width is narrower for a transistor near the Y-decoder.

11. The method of claim 6, wherein the transistor dimension comprises a combination of channel length and channel width.

12. The method of claim 6, further comprising determining a bit line loading after modification of the bit line transistor dimensions and determining whether the bit line loading is the desired bit line loading.

13. The method of claim 12, further comprising calculating a bit line transistor dimension and modifying the bit line transistor dimension based on the calculation, where it is determined that the bit line loading is not the desired bit line loading.

14. A method of manufacturing a memory device comprising:
   determining desired bit line loading;
   calculating a bit line transistor dimension that will achieve the desired bit line loading;
   modifying the bit line transistor dimension based on the calculation; and
   manufacturing a memory device comprising a bit line transistor that includes the modified bit line transistor dimension.

15. The method of claim 14, wherein the transistor dimension comprises a channel length.

16. The method of claim 15, wherein the channel length is longer for a transistor near a Y-decoder.

17. The method of claim 14, wherein the transistor dimension comprises a channel width.

18. The method of claim 17, wherein the channel width is narrower for a transistor near the Y-decoder.

19. The method of claim 14, wherein the transistor dimension comprises a combination of channel length and channel width.

20. A memory device comprising:
   a bit line;
   a first Bit Line Transistor (BLT) coupled to the bit line, the first BLT comprising a channel; and
   a second BLT coupled to the bit line, the second BLT comprising a channel, the dimensions of which are different from the dimensions of the first BLT channel, wherein the channel dimensions for the first and second BLTs comprise a channel width and length, and wherein the channel width and length for the first BLT are different than the channel width for the second BLT.

21. The memory device of claim 20, wherein the channel length for the first BLT is shorter than the channel length for the second BLT.

22. The memory device of claim 20, wherein the channel width for the first BLT is wider than the channel length for the second BLT.

23. The memory device of claim 20, further comprising a Y-decoder, coupled to the first and second BLTs through a bit line and proximate to the second BLT.

24. The memory device of claim 20, wherein the first and second BLTs are in different sectors.

* * * * *